United States Patent
Huang et al.

(10) Patent No.: US 7,393,616 B2
(45) Date of Patent: Jul. 1, 2008

(54) LINE END SPACING MEASUREMENT

(75) Inventors: Jiann Yuan Huang, Hsin-Chu (TW); Anderson Chang, Hsin-Chu (TW); Chih-Ming Ke, Hsinchu (TW); Heng-Jen Lee, Hsinchu County (TW); Chin-Hsiang Lin, Hsinchu (TW); Tsai-Sheng Gau, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 282 days.

(21) Appl. No.: 11/397,464

(22) Filed: Apr. 4, 2006

(65) Prior Publication Data

US 2007/0228003 A1    Oct. 4, 2007

(51) Int. Cl.
*G03F 1/00*    (2006.01)
*G03F 9/00*    (2006.01)
(52) U.S. Cl. .................................. 430/5; 430/22; 430/30
(58) Field of Classification Search ........................ None
See application file for complete search history.

(56) References Cited

U.S. PATENT DOCUMENTS

| 4,579,022 | A | * | 4/1986 | Kasai et al. ................. 76/107.1 |
| 5,862,058 | A | * | 1/1999 | Samuels et al. ................ 716/21 |
| 6,137,901 | A | * | 10/2000 | Harazaki ..................... 382/144 |
| 6,296,977 | B1 | * | 10/2001 | Kaise et al. .................... 430/30 |
| 2003/0224252 | A1 | * | 12/2003 | Zhou et al. ...................... 430/5 |
| 2005/0106473 | A1 | * | 5/2005 | Huang ............................ 430/5 |

* cited by examiner

*Primary Examiner*—Duy-Vu N Deo
(74) *Attorney, Agent, or Firm*—Hayes Boone, LLP

(57) ABSTRACT

A method including: providing collinear first and second lines in a mask layer over a substrate, the first line having at one end a first line end and having a first line body adjacent the first line end, and the second line having at one end a second line end and having a second line body adjacent the second line end; measuring line widths of the first line body and the second line body; locating effective line end positions for the first line end based on the line width of the first line body and for the second line end based on the line width of the second line body; and measuring a distance between the effective line end positions, as an effective line end spacing.

20 Claims, 2 Drawing Sheets

LINE END SPACING MEASUREMENT

BACKGROUND

In semiconductor technologies, critical-dimension (CD) variations can be introduced when a pre-designed feature is transferred from a photomask to a photoresist layer coated on a semiconductor wafer using a photolithography process, and then from the photoresist layer to the semiconductor wafer using an etching process. CD variation introduced from the etching processing (etching bias) may depend on the thickness and profile of the photoresist layer, and varies from line body to line end. However, the current CD measurements of line end spacing do not fully address the above etch bias effect, and thus provide inaccurate prediction for optical proximity correction (OPC) technology.

BRIEF DESCRIPTION OF THE DRAWINGS

Aspects of the present disclosure are best understood from the following detailed description when read with reference to the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting.

Figure 1:
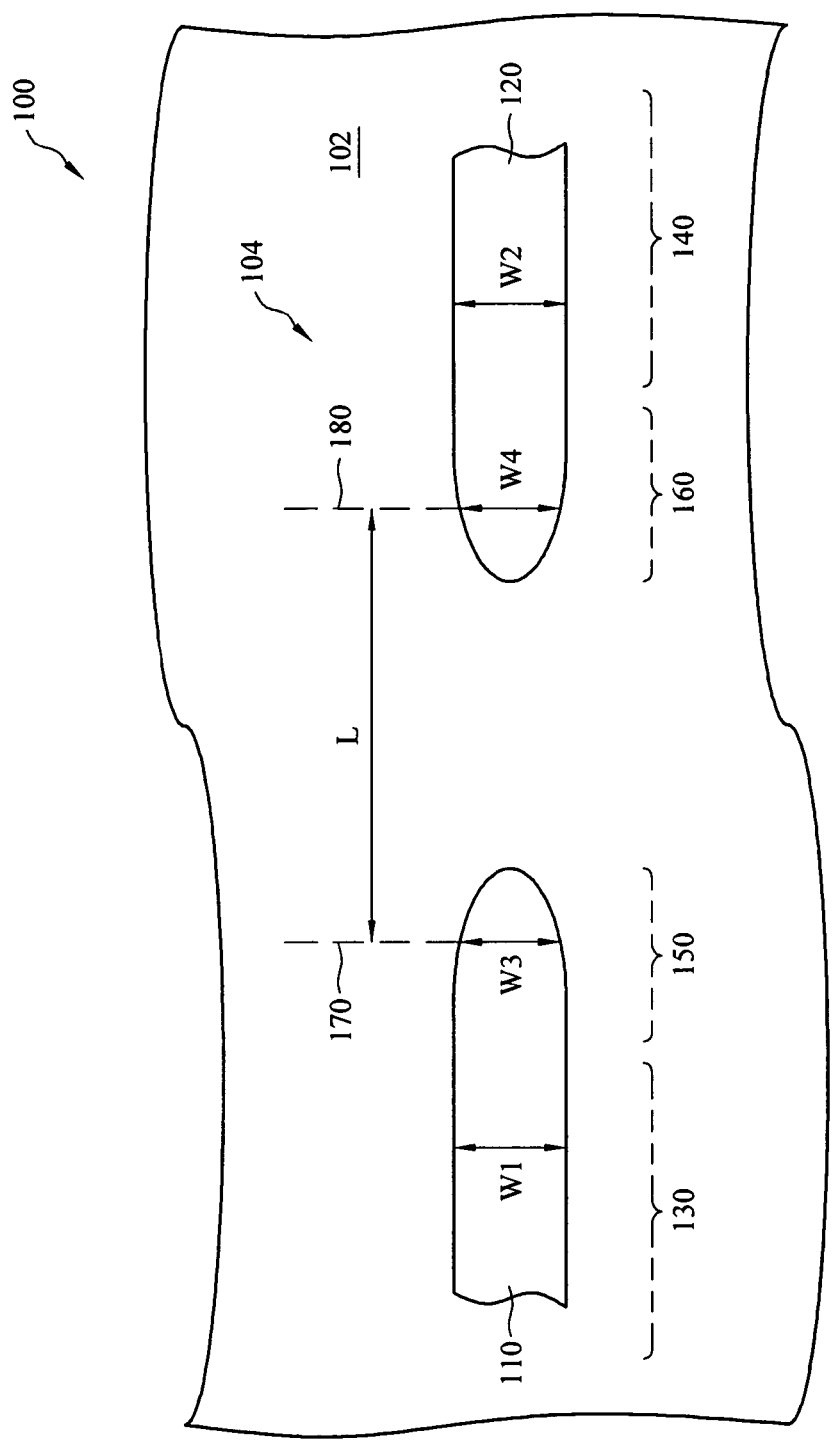
FIG. 1 is a diagrammatic top view of an integrated circuit that includes a line pattern having two collinear lines.

FIG. 1 is a fragmentary diagrammatic top view of part of an integrated circuit 100. The integrated circuit 100 is shown at a partially-completed stage that corresponds to what is known as after-developing-inspection (ADI). The integrated circuit 100 includes a substrate 102. In the disclosed embodiment, the substrate 102 includes a silicon semiconductor wafer including crystalline silicon. The substrate 102 may alternatively include polycrystalline silicon or amorphous silicon. The substrate 102 may alternatively include any other suitable semiconductor material such as elementary semiconductor, compound semiconductor, and/or alloy semiconductor. The semiconductor wafer further includes a plurality of doped regions formed therein and the substrate 102 includes a plurality of patterned conductive and dielectric structures in and/or on the wafer. The substrate 102 may alternatively include non-semiconductor material such as glass used to form thin-film-transistor liquid-crystal display (TFT-LCD) devices, or fused quartz or calcium fluoride used to form a mask (photomask or reticle) pattern.

A line pattern 104 is provided on the substrate 102. The line pattern 104 is a portion of a patterned photoresist (PR) layer taken at a stage of after-developing-inspection (ADI). The line pattern 104 includes a first PR line 110 and a second PR line 120. The first and second PR lines 110 and 120 are collinear. Each line includes a central first portion having a substantially uniform line width. The first portion of a line is referred to as a line body thereof. For example, the first PR line 110 includes a line body 130 that has a line width W1. The second PR line 120 includes a line body 140 that has a line width W2. Each line also includes at least one second portion, referred to as a line end. A line end has a curved edge profile in a top view and therefore has a varying width. The width of a line end decreases from the line width of an associated line body to zero in a direction from the line body to the line end. For example, the first PR line 110 includes a line end 150 and the second PR line 120 includes a line end 160. Line end 150 in line 110 and line end 160 in line 120 are spaced from each other, having a distance therebetween that is referred to as a line end spacing (LES).

The LES between two line ends is an important parameter and may vary from after-development inspection (ADI) to after-etching inspection (AEI), due to an etching process that transfers the line pattern 104 from the photoresist layer to the substrate 102. Lateral etching of the lines 110 and 120 during the etching process may shrink the width of a line from the mask-defined width by an offset, referred to as an etching bias. The etching bias may further depend on the profile and thickness of the PR pattern. The etching bias may vary from the line body to the line end, and may further depend on the PR line shape. The etching bias can change the line end structure and accordingly the LES. Known techniques for LES measurements at ADI can be inconsistent and inaccurate for certain applications, including optical proximity correction (OPC) prediction during mask design. Known techniques for LES measurements may lead to poorly-designed masks, higher electrical failure of IC chips, higher tapeout cost, and other associated issues. Besides, the current critical dimension (CD) measurements may have more variations due to human factors. The disclosed method provides a more accurate way to define and measure an effective LES.

According to the disclosed method, during an LES measurement, the line widths of associated line bodies are measured. For example, the line width W1 of line body 130 and/or the line width of line body 140 are measured. The line widths may be measured using a suitable CD metrology instrument such as CD-scanning electron microscope (CD-SEM) that is known in the art. For example, an image of the line pattern 104 may be taken by the CD SEM tool. Measurements of line widths and other dimensions of the line pattern 104 may be based on such an image of the line pattern 104. In this example, the widths of lines 110 and 120 are measured as W1 and W2, respectively. W1 and W2 may be substantially equal, or may be different.

A line end may have a curved edge profile such as those of line ends 130 and 140, or other curved line end profiles. The line end width may gradually decrease from the line width of the associated line body to zero. Since the line end has a varying width, a given line end width may be associated with a particular position of the line end. That is, the effective line end may be considered to be at a position where the line end has a particular width. The expected line end width associated with the effective line end position is defined as a certain percentage of the line width of the associated line body. The line end is checked for the position where it has the expected width, to identify the effective line end position. In particular, at the effective line end position, the expected line end width (B) is equal to a certain percentage of the line width (A), as $B = N\% \times A$. The parameter $N\%$ can be predefined based on the manufacturing information of related processes utilized to transfer the line pattern 104 in the photoresist layer to an underlying material layer. The related processes include an etching process to etch the underlying material layer under the patterned photoresist layer. The related manufacturing information may include the particular photoresist material, coating recipe, exposure recipe, development recipe, etching processing, line end etching bias, and/or other related manufacturing information. The parameter N % may alternatively be determined based on previous measurement data. In one example, the parameter N % is chosen such that the effective line end position corresponds to a position where the line will really end after the PR line is transferred into the underlying material layer. The parameter N % may be a variable that is dynamically tuned to reflect lithography and etching process drift. In this example, both lines 110 and 120 are checked, as described above, to locate effective line end positions 170 and 180. The widths at the effective line end positions 170 and 180 are labeled as W3 and W4, respectively, in FIG. 1. In the disclosed embodiment, W3 equals N %×W1 and W4 equals N %×W2. An exemplary range of N % is between about 10% and 90%. Another exemplary range is between about 30% and 80%. In one example, N % is about 55%. The line end widths may be measured by the same metrology instrument and utilize the same image of the line pattern 104 that was previously taken to measure the line widths of lines 110 and 120. For example, if a CD-SEM is used, measurement of line end widths is implemented in the same tool and based on the same image of the line pattern 104 taken by the CD-SEM tool.

After the effective line end positions 170 and 180 of lines 110 and 120 are located, a LES (effective LES) can be defined therebetween and measured accordingly. For example, the effective LES between the lines 110 and 120 is measured between the two effective line end positions 170 and 180, and is labeled as L in FIG. 1. The thus extracted effective LES can minimize human error and other errors caused by etching bias related to photoresist profile. The effective LES measurement is more consistent and reliable than conventional measurements without considering etching bias. As a result, the mask design and wafer yield are improved when the disclosed method is adopted in OPC technology.

The effective LES measurement method along with line pattern 104 described above is only one exemplary procedure to illustrate the disclosed method. Other modifications may be applied for better result and other purpose without departure from the spirit of the invention. For example, the effective line end position may be defined differently to reflect other factors. For example, local line pattern density may be considered in defining an effective line end position to include micro etching loading effect. The effective LES results thus obtained may be used for CD control during semiconductor manufacturing, mask design, and/or new process development.

In another example, the patterning of the photoresist layer may not be limited to a conventional photolithography method. The patterning may alternatively be implemented by other proper methods such as maskless photolithography, electron-beam writing, ion-beam writing, and molecular imprint. In another example, the line pattern 104 is not limited to a photoresist material. It may alternatively be formed from other materials, such as a hard mask layer. For example, silicon nitride may be deposited on a wafer to form a hard mask layer and then be patterned into the line pattern 104. The patterned hard mask layer is then used to transfer the lines 110 and 120 therein onto an underlying material layer using an etching process.

The material layer to which the line pattern 104 is to be transferred may include a material such as semiconductor, dielectric, or metal. In one example, the material layer includes poly-crystalline silicon for a poly-silicon gate. The etching process used during patterning of a semiconductor wafer is an anisotropic etching process to etch substantially vertically, and may implement a dry etching.

Figure 2:
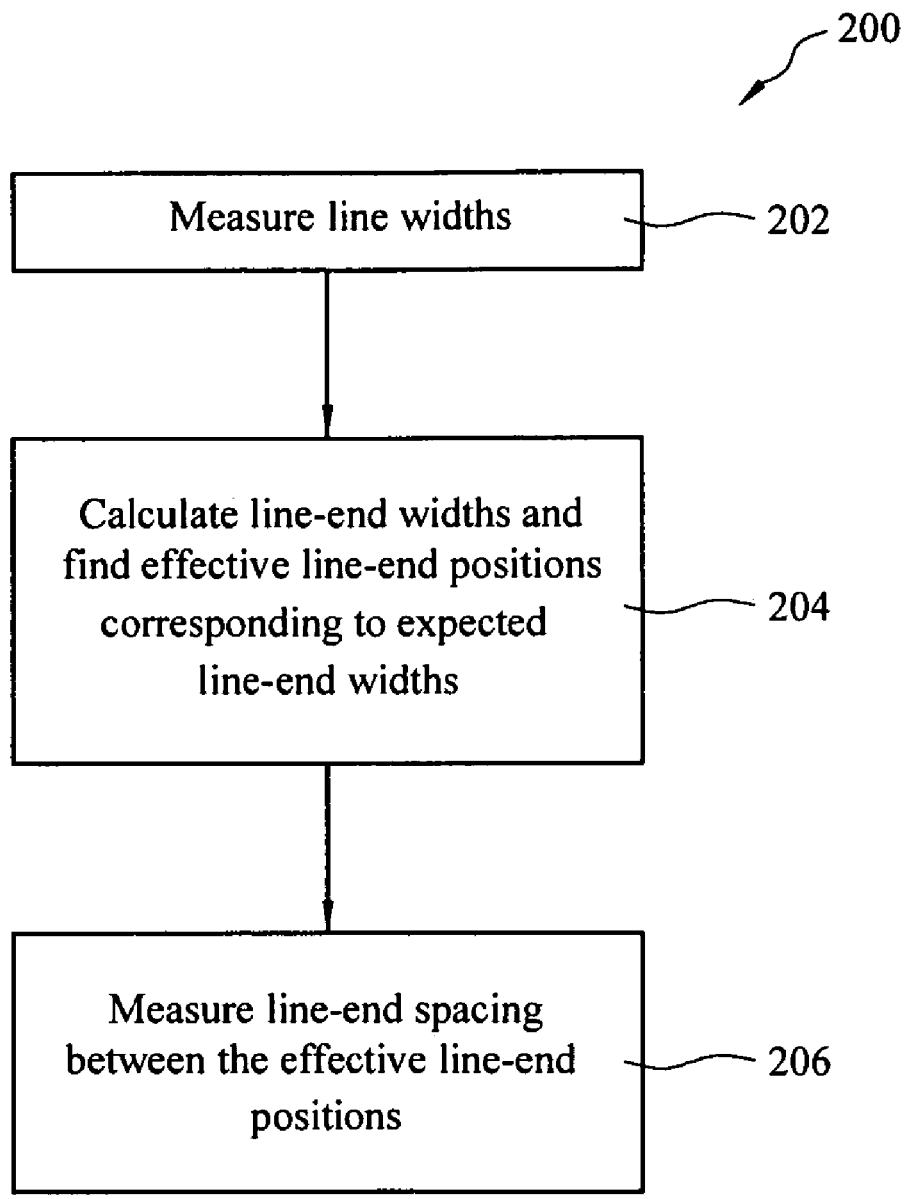
FIG. 2 is a flow chart of a method for measuring line end spacing between two lines such as these shown in FIG. 1.

FIG. 2 illustrates a flow chart of an embodiment of a method 200 to measure an effective line end spacing, as described above in association with FIG. 1. The method 200 begins at block 202 with measurement of the line widths of two lines that are collinear and formed in a mask layer, such as the line pattern 104 in FIG. 1. The method 200 includes block 204 to calculate a line end width to locate an effective line end position defined by an expected line end width relative to the line width of each of the two collinear lines. The method 200 further includes block 206 to measure line end spacing between the effective line end positions determined for the two collinear lines. The method 200 may be alternatively reduced to blocks 202 and 204 for determining an effective line end position. For example, providing a line having a line body and a line end, an effective line end position is determined by first measuring a line-width of the line body and by then locating the effective line end at a position where the line end has a particular width, such as a predefined percentage of the line-width.

Thus the present disclosure provides a method. One form of the method includes providing collinear first and second lines in a mask layer over a substrate, the first line having at one end a first line end and having a first line body adjacent the first line end, and the second line having at one end a second line end and having a second line body adjacent the second line end; measuring line widths of the first line body and the second line body; locating effective line end positions for the first line end based on the line width of the first line body and for the second line end based on the line width of the second line body; and measuring a distance between the effective line end positions, as an effective line end spacing (LES).

In the method, the locating of effective line end positions may include, for each of the first and second lines, locating the line end position at which the line end of that line has a line end width equal to a certain percentage of the line width of that line. The method may include selecting the certain percentage as a function of a transfer technique that can transfer the first and second lines from the mask layer to the substrate. The mask layer may include a photoresist material. The method may include selecting processing information of the transfer technique from the group consisting of photoresist material information, coating recipe, exposure recipe, development recipe, and line end etching bias information. The certain percentage may have a range between about 10% and 90%. The method may include selecting a percentage to be a dynamic parameter dynamically tuned to an etching process of the transfer technique. The mask layer may include a hard mask material. The measuring of line widths, locating of line end positions, and measuring of the distance may be carried out using a critical-dimension (CD) metrology tool. The measuring of line widths, locating of effective line end positions, and measuring of the distance may be carried out using an image of the first and second lines taken by the CD metrology tool. The CD metrology tool may includes a CD scanning electron microscope (CD-SEM). The mask layer may alternatively include a hardmask material.

A different form of the method includes providing collinear first and second lines in a photoresist layer overlying a material layer on a substrate, the first line having at one end a first line end and having a first line body adjacent the first line end, the second line having at one end a second line end and having a second line body adjacent the second line end; measuring a first line width of the first line body and a second line width of the second line body; locating first and second effective line end positions for the first and second line ends, respectively, each line end having at the effective line end position a line end width that is equal to a predefined percentage of the line width of that line; and measuring a distance between the first and second effective line end positions. The method may further include determining the predefined percentage as a function of a transfer technique that transfers the first and second lines from the photoresist layer to the material layer. The transfer technique may include an etching process that etches the material layer to form the first and second lines from the material layer, and may include determining the predefined percentage based on characteristics of the etching process. The transfer technique may include a developing process that forms the first and second lines from the photoresist layer; and include determining the predefined percentage based on characteristics of the etching process. The predefined percentage may range between about 10% and 90%. The predefined percentage may range alternatively between about 30% and 80%.

The present disclosure also provides a method of determining an effective line end. One form of this method includes providing a line in a photoresist layer on a substrate, the line having at one end a line end and having a line body adjacent the line end; measuring the line body to find a line width; and locating an effective line end position of the line end, at which the line end has a width equal to a predefined percentage of the line width. The method may include transferring the line from the photoresist layer to the substrate; and wherein the locating of the effective line end position may includes determining the predefined percentage according to characteristics of the transferring.

The above-mentioned pattern and method can be used in patterning a wafer. However, a similar pattern or method may be alternatively used in patterning a mask. Although selected embodiments of the present disclosure have been described in detail, those skilled in the art should understand that various changes, substitutions and alterations may be made therein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method comprising:
    providing collinear first and second lines in a mask layer over a substrate, the first line having at one end a first line end and having a first line body adjacent the first line end, and the second line having at one end a second line end and having a second line body adjacent the second line end;
    measuring line widths of the first line body and the second line body;
    locating effective line end positions for the first line end based on the line width of the first line body and for the second line end based on the line width of the second line body; and
    measuring a distance between the effective line end positions, as an effective line end spacing (LES).

2. The method of claim 1, wherein the locating of the effective line end positions includes, for each of the first and second lines, locating the line end position at which the line end of that line has a line end width equal to a certain percentage of the line width of that line.

3. The method of claim 2, including selecting the certain percentage as a function of a transfer technique that can transfer a pattern of the first and second lines from the mask layer to the substrate.

4. The method of claim 3, wherein the selecting of the certain percentage is further a function of line end etching bias information.

5. The method of claim 3, including using a photoresist material as the mask layer.

6. The method of claim 5, wherein the selecting of the certain percentage is further a function of processing information for the photoresist material, including at least one of photoresist material information, coating recipe, exposure recipe, and development recipe.

7. The method of claim 2, including selecting the certain percentage to lie within a range between about 10% and 90%.

8. The method of claim 3, including selecting the percentage to be a dynamic parameter dynamically tuned to an etching process of the transfer technique.

9. The method of claim 3, including using a hardmask material as the mask layer.

10. The method of claim 1, wherein the measuring of line widths, locating of effective line end positions, and measuring of the distance are carried out using a critical-dimension (CD) metrology tool.

11. The method of claim 10, wherein the measuring of line widths, locating of line end positions, and measuring of the distance are carried out using an image of the first and second lines taken by the CD metrology tool.

12. The method of claim 10, including selecting a CD scanning electron microscope (CD-SEM) as the CD metrology tool.

13. A method comprising:
    providing collinear first and second lines in a photoresist layer overlying a material layer on a substrate, the first line having at one end a first line end and having a first line body adjacent the first line end, and the second line having at one end a second line end and having a second line body adjacent the second line end;
    measuring a first line width of the first line body and a second line width of the second line body;
    locating first and second effective line end positions for the first and second line ends, respectively, each line end having at the effective line end position a line end width that is equal to a predefined percentage of the line width of that line; and
    measuring a distance between the first and second effective line end positions.

14. The method of claim 13, including determining the predefined percentage as a function of a transfer technique that can transfer a pattern of the first and second lines from the photoresist layer to the material layer.

15. The method of claim 14, wherein the transfer technique includes an etching process that etches the material layer to transfer the pattern of the first and second lines to the material layer; and including determining the predefined percentage based on characteristics of the etching process.

16. The method of claim 13, including a developing process that forms the first and second lines from the photoresist layer, and including determining the predefined percentage as a function of the developing process.

17. The method of claim 13, including selecting the predefined percentage to lie within a range between about 10% and 90%.

18. The method of claim 13, including selecting the predefined percentage to lie within a range between about 30% and 80%.

19. A method of determining an effective line end, comprising:

providing a line in a photoresist layer on a substrate, the line having at one end a line end and having a line body adjacent the line end;

measuring the line body to find a line width; and locating an effective line end position of the line end, at which the line end has a width equal to a predefined percentage of the line width.

20. The method of claim 19, including transferring a pattern of the line from the photoresist layer to the substrate; and wherein the locating of the effective line end position includes determining the predefined percentage according to characteristics of the transferring.

* * * * *